US006010399A

United States Patent [19]
Lee et al.

[11] Patent Number: 6,010,399
[45] Date of Patent: Jan. 4, 2000

[54] USE OF A SENSOR TO CONTROL THE FAN FILTER UNIT OF A STANDARD MECHANICAL INTER FACE

[75] Inventors: Ban-Yaw Lee, Yun-Lin; Chen-Chin Chen, Miao-Li; Yue Tsang Hsu, Hsin-Chu; Reuy-Huang Huang, Hsin-Chu; Kun-Chih Huang, Hsin-Chu, all of Taiwan

[73] Assignee: Taiwan Semiconductor Manufacturing Company, Ltd., Hsin-Chu, Taiwan

[21] Appl. No.: 08/755,857

[22] Filed: Dec. 2, 1996

[51] Int. Cl.[7] ........................................................ H05K 5/00
[52] U.S. Cl. .......................... 454/187; 454/195; 414/935
[58] Field of Search .................................. 454/187, 184, 454/188, 195; 414/935, 940

[56] References Cited

U.S. PATENT DOCUMENTS

| | | | |
|---|---|---|---|
| 4,705,951 | 11/1987 | Layman et al. | 250/442.1 |
| 4,812,810 | 3/1989 | Query et al. | 340/545 |
| 4,851,018 | 7/1989 | Lazzari et al. | 55/356 |
| 4,967,083 | 10/1990 | Kornbrekke et al. | 250/341 |
| 5,329,949 | 7/1994 | Moncourtois et al. | 134/57 |
| 5,390,785 | 2/1995 | Garric et al. | 206/213.1 |

*Primary Examiner*—Harold Joyce
*Assistant Examiner*—Derek S. Boles
*Attorney, Agent, or Firm*—George O. Saile; Stephen B. Ackerman

[57] ABSTRACT

A Standard Mechanical Inter Face is described where a sensor causes a fan in a fan filter unit, attached to a Standard Mechanical Inter Face, to be turned on or off depending on the position of the door in semiconductor wafer equipment. An apparatus for realizing this and a method for its use are given. Two examples of sensors for realizing this invention are described. A preferred embodiment of the invention is the use of an infrared sensor placed within the Standard Mechanical Inter Face and containing an infrared transmitter and infrared receiver in one housing.

23 Claims, 2 Drawing Sheets

USE OF A SENSOR TO CONTROL THE FAN FILTER UNIT OF A STANDARD MECHANICAL INTER FACE

BACKGROUND OF THE INVENTION

1. Field of the Invention

This invention relates to the field of infrared sensors, more particularly to the control of the fan in a Fan Filter Unit for a Standard Mechanical Inter Face.

2. Description of the Prior Art

In prior art the Standard Mechanical Inter Face (SMIF) for control of particulates in semiconductor wafer fabrication uses software control between host, SMIF, and semiconductor wafer equipment to control the operation of the fan in the Fan Filter Unit (FFU). Some of the problems associated with the software control include lengthy integration of host, SMIF, and semiconductor wafer equipment, system down time because of software complexity, and difficulty in trouble shooting.

An arrangement sensing whether a door is open or closed is found in U.S. Pat. No. 4,812,810. In this patent a fiber optic sensor is used to detect if a door or doors of a domestic appliance such as a refrigerator are ajar. U.S. Pat. No. 4,967,083 describes a sensor system for an automatic sliding door employing multiple sensor modules. U.S. Pat. No. 5,329,949 describes activation of a radio remote-controlled vehicle wash system by an infrared motion sensor.

SUMMARY OF THE INVENTION

It is an object of the present invention to provide an apparatus and a method to sense if an access door in a Standard Mechanical Inter Face is open or closed.

It is another object of the present invention to insure that closing of the access door in a Standard Mechanical Inter Face results in turning on the fan of the Fan Filter Unit, and opening of the access door results in turning off the fan of the Fan Filter Unit.

It is a further object of the present invention to provide an apparatus and a method which ensure that consistent air pressure in the Standard Mechanical Inter Face is maintained and thus to prevent air turbulence.

These objects have been accomplished by placing one or more sensors within the Standard Mechanical Inter Face which detect the position of the access door and accordingly cause the fan of the Fan Filter Unit to be turned on or off. Various types of sensors may be employed to detect the opening and closing of the access door depending on the physical arrangement of the Standard Mechanical Inter Face. Two sensors are described, but the invention is not limited to these. The first embodiment is an infrared sensor, the second embodiment is an elctromechanical switch.

BRIEF DESCRIPTION OF THE DRAWINGS

FIG. 3 is a cross sectional view of which FIG. 1 is a plan view.

DESCRIPTION OF THE PREFERRED EMBODIMENT

The Standard Mechanical Inter Face (SMIF) is an add-on to existing semiconductor wafer manufacturing equipment and controls particulates in the air. A SMIF consists of a) a sealed wafer carrier for a cassette of semiconductor wafers, allowing movement in a cleanroom without danger of contaminating the semiconductor wafers, b) a Fan Filter Unit (FFU) providing filtered air for the interior of the SMIF, and c) mechanical means of moving the cassette between the wafer carrier and the semiconductor wafer processing equipment to which the SMIF is attached. Access between the SMIF and the processing equipment is via an access door, which is only open at the time the carrier passes through.

While the door is open the fan of the FFU must be off to prevent turbulence between fan air and the processing equipment air flow. The processing equipment insures at that time air pressure in the SMIF of 30 psi, but this pressure may range from 10 to 100 psi. When the door is closed the fan of the FFU must be on to insure air flow i.e. cleaned air. Commercially available SMIFs control the opening/closing of the access door and the related turning off/on of the FFU fan through software between a host, the SMIF and the processing equipment. This system is complex and prone to failure. A simpler and better solution was sought which is the subject of the present invention.

Figure 1:
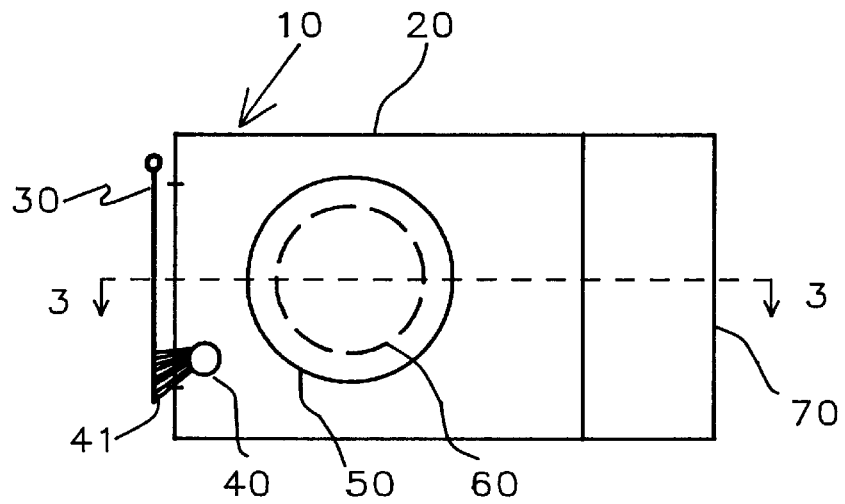
FIG. 1 is a plan view of the Standard Mechanical Inter Face with the infrared sensor of the invention and the access door closed.

Referring now to FIG. 1, we show an apparatus depicting the present invention. Apparatus 10 consists of a Standard Mechanical Inter Face (SMIF) 20, with an access door 30 and a sensor or sensors 40. On top of the SMIF is a sealed wafer carrier 50 holding a cassette 60 of semiconductor wafers. A Fan Filter Unit (FFU) 70 attached to the SMIF provides air for the cassette and interior of the SMIF. The FFU may have more than one filter and more than one blower motor depending on the required air flow. Through robotic means the cassette 60 is removed from the carrier 50, pulled into the SMIF and passed through access door 30 into the semiconductor processing equipment (not shown). After the cassette has passed through, the door closes again, sealing the opening. In a similar way the door opens to let the cassette return to the SMIF and then closes again to seal the SMIF from the semiconductor processing equipment. The opening and closing of the door is controlled by the semiconductor processing equipment.

In the preferred embodiment, at least one infrared sensor 40, capable of detecting the opening and closing of the access door, is mounted within the SMIF. The infrared sensor consists of an infrared transmitter and an infrared receiver, mounted in close proximity to each other. The infrared transmitter emits radiation 41 in the infrared region of the electromagnetic spectrum, and is placed in such a way that the infrared radiation radiates in the direction of the access door. The wavelength of the radiation is in the range from 0.8 to 300 microns. The infrared receiver senses the presence or absence of radiation 41 reflected from the access door. When the access door is closed the infrared receiver receives reflected infrared radiation and causes the fan of the FFU to be turned on. When the access door is open the infrared receiver does not receive reflected infrared radiation and causes the fan of the FFU to be turned off.

Figure 2:
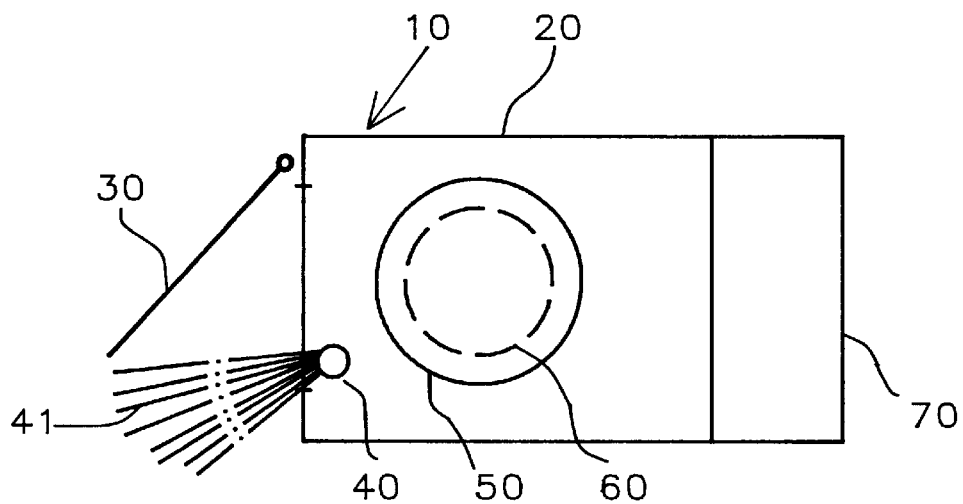
FIG. 2 is a plan view of the Standard Mechanical Inter Face with the infrared sensor of the invention and the access door opened.

FIG. 2 shows the embodiment of the present invention when access door 30 is opened sufficiently for the infrared receiver not to receive infrared reflections from the door.

Figure 3:
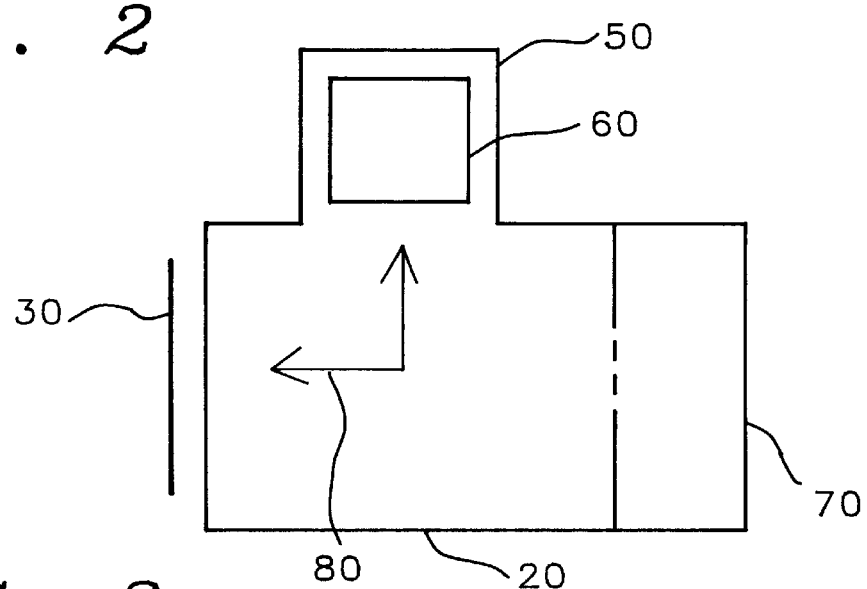

The infrared sensor may be mounted anywhere within the SMIF as long as the infrared receiver is mounted perpendicular to the door and receives reflected infrared radiation when the door is closed, and does not receive reflected infrared radiation when the door is not closed. A cross section along line 3—3 of one physical arrangement of the present invention, of which FIG. 1 is a plan view, is shown in FIG. 3. The movement of cassette 60 from the sealed wafer carrier 50 to access door 30 is depicted by arrow 80. Other arrangement of the carrier, door, filter unit and sensor are of course possible and fall within the scope of the invention.

The advantages of this present invention are that the access door is controlled by the semiconductor processing equipment, that the infrared sensor monitors whether the access door is open or closed and accordingly activates or deactivates the fan of the FFU. This is a much simpler and less trouble-some system than the host controlled software system, where the host controls both the opening and closing of the access door in the semiconductor wafer processing equipment and the turning on and off of the FFU. Because of the greater simplicity of the present invention there is no need for a system integration effort, and the system is more stable resulting in decreased downtime and reduced maintenance cost.

Another way of sensing if the access door is open or closed is by using an electromechanical switch (not. shown) mounted within the SMIF which gets activated by the closing of the door. When the door is closed and the switch is activated the fan of the FFU is turned on. When the door opens and the switch is deactivated the fan of the FFU is turned off. There are other sensors which can be used to activate or deactivate the fan, but it is understood that these means are only variations of this invention and known to those skilled in the art. The placement of the electromechanical switch is not very critical as long as the closed door is reliable detected. Placement of the switch depends to a large extend on the physical layout of the particular SMIF employed.

Figure 4:
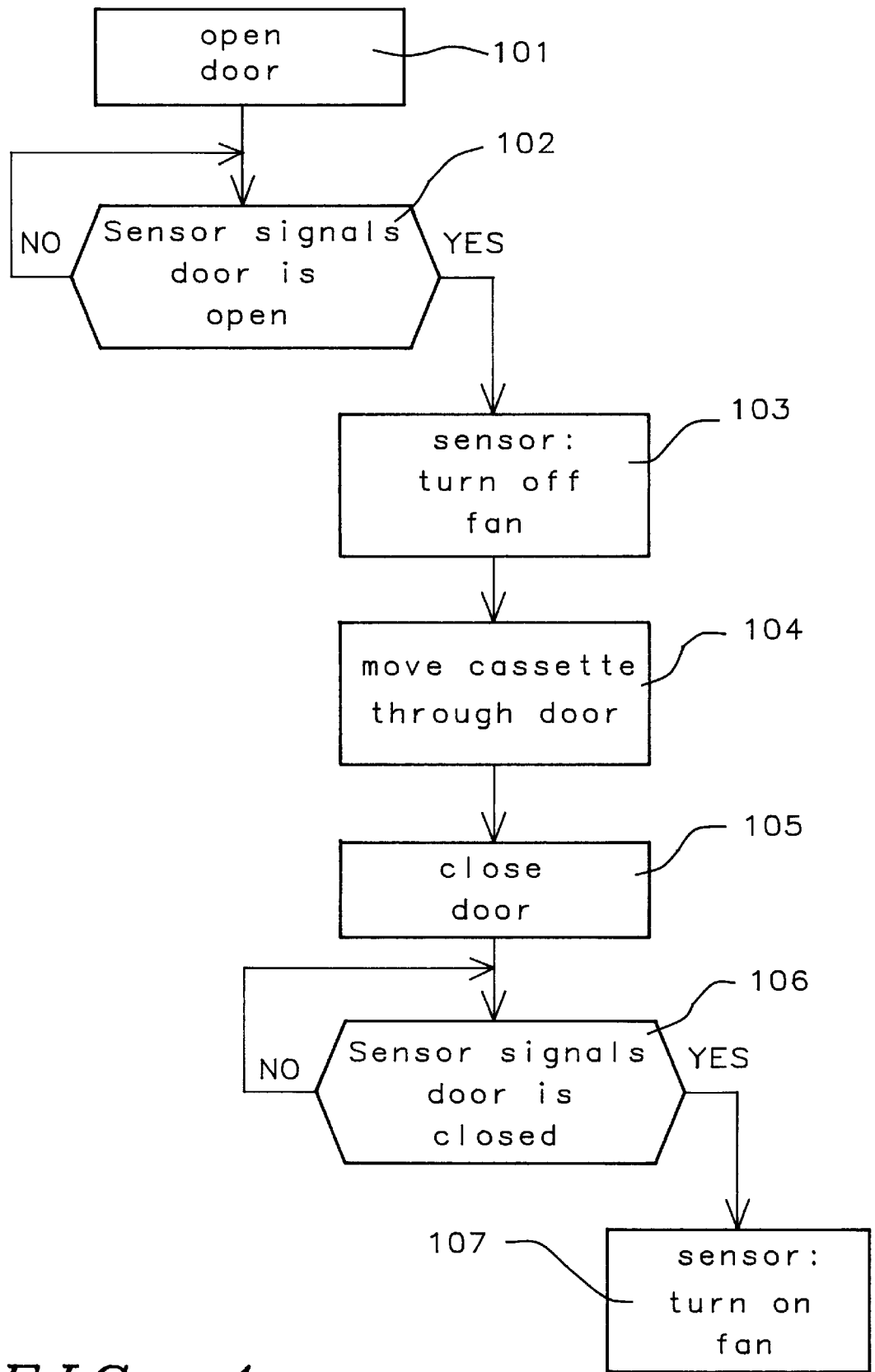
FIG. 4 is a flow diagram of the method of the invention.

FIG. 4 shows a flow diagram of the method of the invention. In block 101 the semiconductor processing equipment causes door 30 to be opened. In block 102 sensor 40 waits until the door is opened sufficiently before signaling to the FFU 70, in block 103, to turn off the fan of the FFU. Block 104 allows cassette 60 to move through the door. Block 105 directs the semiconductor processing equipment to close the door. In block 106 the sensor waits until the door is closed before signaling to the FFU, in block 107, to turn on the fan. The sequence is then completed; it is followed not matter in which direction the cassette moves.

The method of providing a SMIF, attaching a FFU, access door, and placing at least one sensor within the SMIF causes the fan in the FFU to be turned on when the access door is closed and the fan to be turned off when the access door is not closed. This method also ensures the proper air pressure in the range of 10 to 100 psi is maintained within the SMIF regardless of the position of the door. By maintaining uniform air pressure, air turbulence within the SMIF is also avoided. Providing uniform and proper air pressure and filtered air to the SMIF prevents contamination of the semiconductor wafers by particles in the air while the wafers are transported through the SMIF.

While the invention has been particularly shown and described with reference to the preferred embodiments thereof, it will be understood by those skilled in the art that various changes in form and details may be made without departing from the spirit and scope of the invention.

What is claimed is:

1. A apparatus for sensing if a passageway between semiconductor manufacturing equipment is open or closed, comprising:

a Standard Mechanical Inter Face with a sealed wafer carrier holding a cassette of semiconductor wafers;

a Fan Filter Unit attached to said Standard Mechanical Inter Face providing filtered air for said cassette of semiconductor wafers;

an access door opening and closing said Standard Mechanical Inter Face, thus providing access to a semiconductor processing tool, and at least one sensor capable of detecting the opening and closing of said access door.

2. The apparatus of claim 1, wherein said Standard Mechanical Inter Face holds said cassette of semiconductor wafers in transit to and from said semiconductor wafer processing tool.

3. The apparatus of claim 1, wherein said Fan Filter Unit is part of said Standard Mechanical Inter Face and provides filtered air for said cassette of semiconductor wafers through use of at least one filter and at least one fan with means of moving air.

4. The apparatus of claim 1, wherein said access door opens said Standard Mechanical Inter Face to load said cassette of semiconductor wafers into said semiconductor wafer processing tool.

5. The apparatus of claim 1, wherein said access door closes said Standard Mechanical Inter Face after said cassette of semiconductor wafers is loaded into said semiconductor wafer processing tool.

6. The apparatus of claim 1, wherein said access door opens said Standard Mechanical Inter Face to unload said cassette of semiconductor wafers from said semiconductor wafer processing tool.

7. The apparatus of claim 1, wherein said access door closes said Standard Mechanical Inter Face after said cassette of semiconductor wafers is unloaded from said semiconductor wafer processing tool.

8. The apparatus of claim 1, wherein said processing tool can maintain air pressure ranging from 10 to 100 psi in said Standard Mechanical Inter face while said access door is open.

9. The apparatus of claim 1, wherein said sensor is mounted within said Standard Mechanical Inter Face.

10. The apparatus of claim 9, wherein said sensor is an infrared sensor, said infrared sensor comprising:

an infrared transmitter, emitting radiation in an infrared region of the electromagnetic spectrum, and placed in such a way that the infrared radiation radiates in the direction of said access door, and an infrared receiver, mounted in close proximity to said infrared transmitter, for receiving infrared radiation which is reflected from said access door.

11. The apparatus of claim 10, wherein said infrared receiver receives reflected infrared radiation when said access door is closed.

12. The apparatus of claim 10, wherein said infrared receiver does not receive reflected infrared radiation when said access door is not closed.

13. The apparatus of claim 10, wherein said infrared receiver causes said fan to be turned off when said infrared receiver does not receive reflected infrared radiation.

14. The apparatus of claim 10, wherein said infrared receiver causes said fan to be turned on when said infrared receiver receives reflected infrared radiation.

15. The apparatus of claim 10, wherein said infrared sensor may be mounted anywhere within said Standard Mechanical Inter Face as long as said infrared receiver receives reflected infrared radiation when said access door is closed.

16. The apparatus of claim 10, wherein said infrared sensor may be mounted anywhere within said Standard Mechanical Inter Face as long as said infrared receiver does not receive reflected infrared radiation when said access door is not closed.

17. The apparatus of claim 10, wherein the wavelength of said infrared sensor ranges from about 0.8 microns to 300 microns.

18. The apparatus of claim 9, wherein said sensor is an electromechanical switch, said electromechanical switch comprising:

a mechanical means for operating an electrical contact when said access door presses on said mechanical means.

19. The apparatus of claim 18, wherein said electromechanical switch causes said fan to be turned off when said access door is not closed.

20. The apparatus of claim 18, wherein said electromechanical switch causes said fan to be turned on when said access door is closed.

21. A method for sensing if a passageway between semiconductor manufacturing equipment is open or closed, comprising:

providing a Standard Mechanical Inter Face with a sealed wafer carrier holding a cassette of semiconductor wafers;

providing a Fan Filter Unit to said Standard Mechanical Inter Face to deliver filtered air for said cassette of semiconductor wafers;

providing an access door, said access door opening and closing said Standard Mechanical Inter Face, thus giving access to a semiconductor processing tool;

placing at least one sensor, capable of detecting the opening and closing of said access door, within said Standard Mechanical Inter Face;

moving said cassette between said wafer carrier and said semiconductor wafer processing equipment;

opening and closing said access door;

detecting with said sensor that said access door is opening;

detecting with said sensor that said access door is closing;

causing said fan in said Fan Filter Unit to be turned off when said access door is opening, and causing said fan in said Fan Filter Unit to be turned on when said access door is closing.

22. The method of claim 21, wherein said sensor is an infrared sensor.

23. The method of claim 21, wherein said sensor is an elctromechanical switch.

* * * * *